(12) United States Patent
Amanapu et al.

(10) Patent No.: US 11,031,337 B2
(45) Date of Patent: *Jun. 8, 2021

(54) FORMING DUAL METALLIZATION INTERCONNECT STRUCTURES IN SINGLE METALLIZATION LEVEL

(71) Applicant: International Business Machines Corporation, Armonk, NY (US)

(72) Inventors: Hari P. Amanapu, Guilderland, NY (US); Charan V. Surisetty, Clifton Park, NY (US); Raghuveer R. Patlolla, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/445,428

(22) Filed: Jun. 19, 2019

(65) Prior Publication Data

US 2019/0311986 A1 Oct. 10, 2019

Related U.S. Application Data

(63) Continuation of application No. 15/855,133, filed on Dec. 27, 2017, now Pat. No. 10,559,530.

(51) Int. Cl.
| | |
|---|---|
| *H01L 21/768* | (2006.01) |
| *H01L 23/532* | (2006.01) |
| *H01L 23/528* | (2006.01) |

(52) U.S. Cl.
CPC ...... *H01L 23/5283* (2013.01); *H01L 21/7684* (2013.01); *H01L 21/76816* (2013.01);
(Continued)

(58) Field of Classification Search
CPC ......... H01L 21/76802; H01L 21/76816; H01L 21/76841; H01L 21/76846; H01L 21/76877; H01L 23/53238
See application file for complete search history.

(56) References Cited

U.S. PATENT DOCUMENTS

| | | | |
|---|---|---|---|
| 5,470,788 A | 11/1995 | Biery et al. | |
| 6,597,067 B1 * | 7/2003 | Biery | ................ H01L 23/5283 257/700 |

(Continued)

OTHER PUBLICATIONS

Disclosed Anonymously, "Hybrid Refractory Metal-Copper Wiring Metallization Scheme for Integrated Circuits," IP.com No. IPCOM000223293D, Nov. 15, 2012, 4 pages.

(Continued)

*Primary Examiner* — Phat X Cao
(74) *Attorney, Agent, or Firm* — James Nock; Ryan, Mason & Lewis, LLP

(57) ABSTRACT

Techniques are provided to fabricate metallic interconnect structures in a single metallization level, wherein different width metallic interconnect structures are formed of different metallic materials to eliminate or minimize void formation in the metallic interconnect structures. For example, a semiconductor device includes an insulating layer disposed on a substrate, and a first metallic line and a second metallic line formed in the insulating layer. The first metallic line has a first width, and the second metallic line has a second width which is greater than the first width. The first metallic line is formed of a first metallic material, and the second metallic line is formed of a second metallic material, which is different from the first metallic material. For example, the first metallic material is cobalt or ruthenium, and the second metallic material is copper.

14 Claims, 15 Drawing Sheets

(52) U.S. Cl.
CPC .. *H01L 21/76846* (2013.01); *H01L 21/76847* (2013.01); *H01L 21/76871* (2013.01); *H01L 21/76873* (2013.01); *H01L 21/76877* (2013.01); *H01L 21/76883* (2013.01); *H01L 23/53238* (2013.01); *H01L 23/53266* (2013.01)

(56) References Cited

U.S. PATENT DOCUMENTS

| | | | |
|---|---|---|---|
| 6,979,625 B1 | 12/2005 | Woo et al. | |
| 7,790,617 B2 | 9/2010 | Lim et al. | |
| 8,003,527 B2* | 8/2011 | Sunayama | H01L 21/2885 |
| | | | 257/E21.582 |
| 8,796,854 B2 | 8/2014 | Yang et al. | |
| 8,823,182 B2 | 9/2014 | Chua et al. | |
| 8,853,072 B2 | 10/2014 | Wood et al. | |
| 9,536,830 B2 | 1/2017 | Bao et al. | |
| 9,754,883 B1* | 9/2017 | Briggs | H01L 21/7685 |
| 10,559,530 B2* | 2/2020 | Amanapu | H01L 21/76883 |
| 2006/0276030 A1* | 12/2006 | Wang | H01L 21/02068 |
| | | | 438/631 |
| 2008/0128773 A1* | 6/2008 | Moll | H01L 27/10894 |
| | | | 257/300 |
| 2008/0296728 A1* | 12/2008 | Yang | H01L 23/5252 |
| | | | 257/530 |
| 2012/0223412 A1* | 9/2012 | Baars | H01L 27/10852 |
| | | | 257/532 |
| 2012/0306104 A1 | 12/2012 | Choi et al. | |
| 2013/0026635 A1 | 1/2013 | Yang et al. | |
| 2014/0167268 A1 | 6/2014 | Bao et al. | |
| 2014/0284801 A1 | 9/2014 | Kitamura et al. | |
| 2014/0291819 A1 | 10/2014 | Barth | |
| 2014/0319685 A1 | 10/2014 | Bao et al. | |
| 2014/0332924 A1 | 11/2014 | Bao et al. | |
| 2014/0332963 A1 | 11/2014 | Filippi et al. | |
| 2014/0346674 A1 | 11/2014 | Bao et al. | |
| 2015/0137377 A1 | 5/2015 | Bao et al. | |
| 2017/0133317 A1* | 5/2017 | Kim | H01L 23/5283 |
| 2017/0256449 A1* | 9/2017 | Zhang | H01L 21/76882 |
| 2018/0090372 A1 | 3/2018 | Briggs et al. | |

OTHER PUBLICATIONS

List of IBM Patents or Patent Applications Treated as Related, Jun. 19, 2019, 2 pages.

* cited by examiner

FORMING DUAL METALLIZATION INTERCONNECT STRUCTURES IN SINGLE METALLIZATION LEVEL

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper material is known to significantly reduce resistance in the BEOL interconnect structure, resulting in improved conduction and higher performance. However, as copper interconnect structures are scaled down with smaller widths and pitches, copper interconnects are prone to void formation which takes place during copper filling of narrow trenches or openings formed in an interlevel dielectric (ILD) layer. The formation of voids in copper interconnects causes an increase in the electrical resistance of such interconnects, which in turn results in an increase of the RC delay of the integrated circuit.

SUMMARY

Embodiments of the invention include methods for fabricating metallic interconnect structures in a single metallization level, wherein different width metallic interconnect structures are formed of different metallic materials to eliminate or minimize void formation in the metallic interconnect structures. For example, a method according to an embodiment of the invention comprises: forming an insulating layer on a substrate; patterning the insulating layer to form a plurality of trench openings in the insulating layer, wherein the plurality of trench openings comprises a first trench opening having a first width, and a second trench opening having a second width, which is greater than the first width; depositing a first layer of liner material to form a first liner layer on sidewall and bottom surfaces of the first and second trench openings; depositing a first layer of metallic material to fill the first trench opening with metallic material, wherein the metallic material within the first trench opening comprises a first metallic line; forming an etch protection layer to protect the metallic material within the first trench opening; performing an etch process to remove a portion of the first layer of metallic material within the second trench opening, while the etch protection layer protects the metallic material within the first trench opening from being etched during the etch process; and depositing a second layer of metallic material to fill the second trench opening with metallic material, wherein the metallic material within the trench opening comprises a second metallic line.

Another embodiment of the invention includes a semiconductor device which comprises an insulating layer disposed on a substrate, and a first metallic line and a second metallic line formed in the insulating layer. The first metallic line has a first width and the second metallic line has a second width which is greater than the first width. The first metallic line is formed of a first metallic material, and the second metallic line is formed of a second metallic material, which is different from the first metallic material. In one embodiment, the first metallic material comprises one of cobalt and ruthenium, and the second metallic material comprises one of copper and tungsten.

Other embodiments will be described in the following detailed description of embodiments, which is to be read in conjunction with the accompanying figures.

BRIEF DESCRIPTION OF THE DRAWINGS

FIGS. 1 through 11B schematically illustrate a method for fabricating metallic interconnect structures according to an embodiment of the invention, wherein:

FIG. 1 is a schematic cross-sectional side view of a semiconductor device at an intermediate stage of fabrication comprising an insulating layer formed on a substrate;

FIG. 2 is a schematic cross-sectional side view of the semiconductor device shown in FIG. 1 after patterning the insulating layer to form a plurality of trench openings including narrow and wide trench openings;

FIG. 3 is a schematic cross-sectional side view of the semiconductor device shown in FIG. 2 after forming a conformal liner layer over the surface of the semiconductor device;

FIG. 4 is a schematic cross-sectional side view of the semiconductor device shown in FIG. 3 after depositing a first layer metallic material to fill the narrow trench openings in the insulating layer with metallic material;

FIG. 5 is schematic cross-sectional side view of the semiconductor device shown in FIG. 4 after planarizing the surface of the semiconductor structure to remove the overburden portion of the first layer of metallic material disposed on the upper surface of the insulating layer, and to form metallic lines in the narrow trench openings;

FIG. 6 is a schematic cross-sectional side view of the semiconductor device shown in FIG. 5 after depositing a conformal etch protection layer over the surface of the semiconductor structure;

FIG. 7 is a schematic cross-sectional side view of the semiconductor device shown in FIG. 6 after patterning the etch protection layer to remove the portion of the etch protection layer which covers the wide trench opening and expose a residual portion of the first layer of metallic material within the wide trench opening;

FIG. 8 is a schematic cross-sectional side view of the semiconductor device shown in FIG. 7 after removing the residual portion of the first layer of metallic material within the wide trench opening;

FIG. 9 is a schematic cross-sectional side view of the semiconductor device shown in FIG. 8 after depositing a second conformal liner layer and a seed layer to line the sidewall and bottom surfaces of the wide trench opening;

FIG. 10 is a schematic cross-sectional side view of the semiconductor device shown in FIG. 9 after depositing a second layer metallic material to fill the wide trench opening in the insulating layer with metallic material; and FIGS. 11A and 11B are schematic views of the semiconductor device shown in FIG. 9 after planarizing the surface of the semiconductor structure down to the upper surface of the insulating layer to remove the overburden portions of the second layer of metallic material and the conformal liner layer disposed on the upper surface of the insulating layer, and form a metallic line in the wide trench opening of the insulating layer.

FIGS. 12-14 schematically illustrate a method for fabricating metallic interconnect structures according to another embodiment of the invention, wherein:

FIG. 12 is a schematic cross-sectional side view of the semiconductor device shown in FIG. 4 after depositing a conformal etch protection layer over the first layer of metallic material;

FIG. 13 is a schematic cross-sectional side view of the semiconductor device shown in FIG. 11 after patterning the etch protection layer to remove a portion of the etch protection layer which covers the wide trench opening, and expose a portion of the first layer of metallic material within the wide trench opening; and FIG. 14 is a schematic cross-sectional side view of the semiconductor device shown in FIG. 12 after removing the portion of the first layer of metallic material within the wide trench opening.

DETAILED DESCRIPTION

Figure 1:
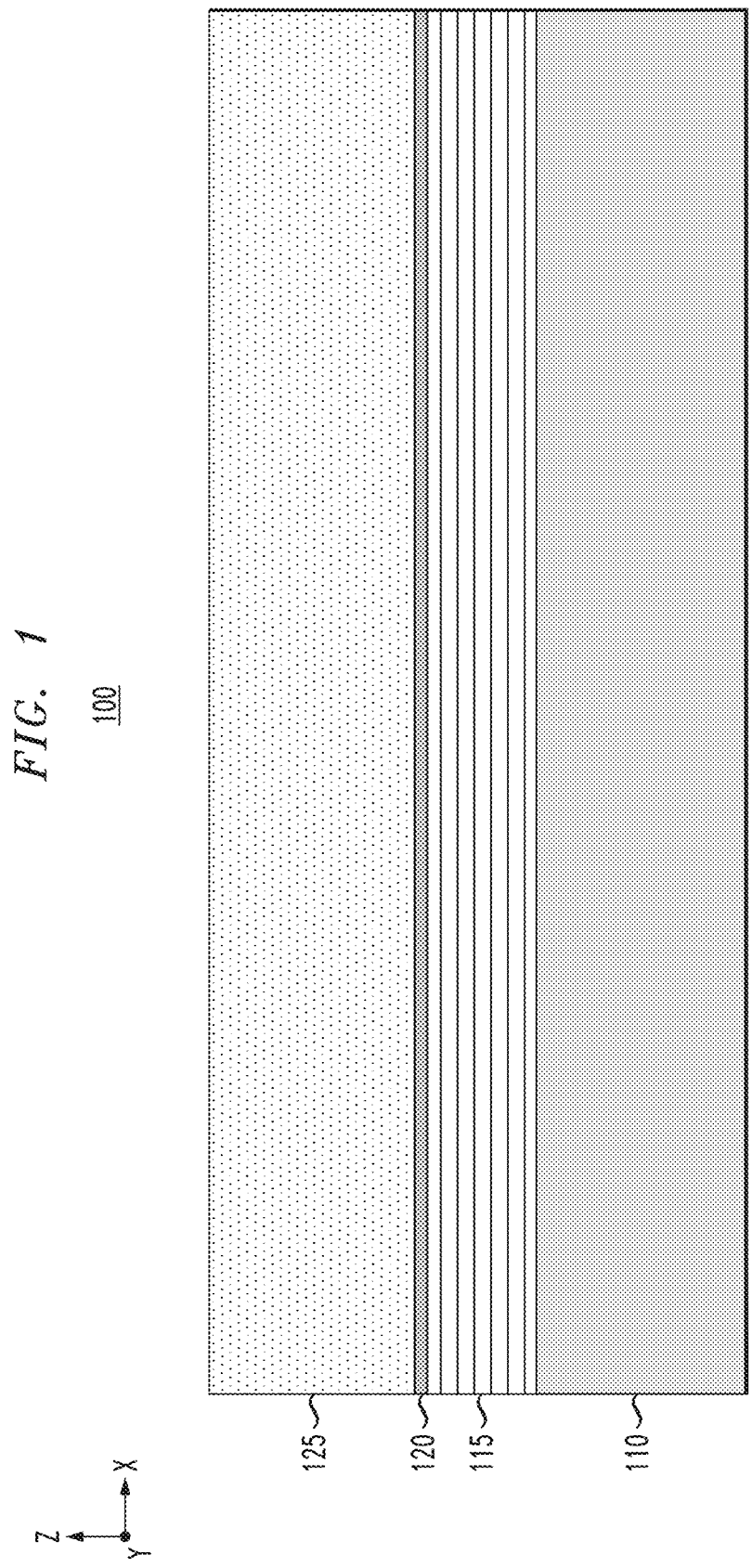

Embodiments will now be described in further detail with regard to methods for fabricating metallic interconnect structures in a single metallization level, wherein different width metallic interconnect structures are formed of different metallic materials to eliminate or minimize void formation in the metallic interconnect structures. As noted above, the scaling down of copper interconnect structures renders copper interconnects prone to void formation which takes place during copper filling of narrow trenches or openings formed in an ILD layer. The void formation in copper interconnects can occur for various reasons. For example, copper interconnects require relatively thick diffusion barrier layers to be formed on the sidewall and bottom surfaces of the trenches and via openings formed in an ILD layer. The thickness of the copper diffusion barrier layer cannot be scaled, and the diffusion barrier layers must be deposited to ensure that there is a minimum thickness on all regions of the sidewall and bottom surfaces of the trenches and via openings. Diffusion barrier layers are typically formed using physical vapor deposition (PVD), which provides less than optimal step coverage. For narrow trenches and via openings with high aspect ratios, the step coverage of diffusion barrier layers becomes even more problematic, leading to the deposition of more diffusion barrier material at the upper regions of the trenches and via openings, and less diffusion barrier material toward the middle and bottom regions of the trenches and via openings, thus reducing the width of the opening at the top of such features. With the reduced width at the top of the trenches and via openings, copper "pinch-off" can occur during a subsequent copper fill process, leading to void formation in the copper material within the trench or via opening.

Furthermore, copper interconnects are typically formed using electroplating methods (electro chemical deposition (ECD)). ECD copper cannot be formed directly on a diffusion barrier layer. Instead, a copper seed layer is typically formed on the diffusion barrier layer using PVD or chemical vapor deposition (CVD), and then ECD copper is deposited on the copper seed layer. However, as trench and via openings are scaled down, it becomes more difficult to deposit uniform seed layers over the diffusion barrier layer within the trench/via openings using PVD, leading to poor seed layer coverage. In some regions, the seed layer coverage can be non-existent, such that ECD copper does not deposit on such regions, thereby resulting in the formation of voids in the ECD copper at the sidewall and bottom surfaces of the trench/via openings. Furthermore, the non-uniform deposition of a PVD seed layer can result in the formation of thicker seed layers at the upper regions of the trenches and via openings, further exacerbating the "pinch-off" phenomenon. Furthermore, the use of thick diffusion barrier layers and seed layers in narrow trenches and via openings consumes a large amount of area and volume, which reduces the amount (volume) of copper material within such openings, leading to increased resistivity of the copper interconnect structure.

In accordance with embodiments of the invention, metallic materials other than copper are utilized to fill narrow trenches or via openings in an insulating layer (e.g., ILD layer) to enable void-free formation of metallic interconnects in such narrow trenches and via openings. The types of metals that are used to fill narrow trenches or via openings in accordance with embodiments of the invention comprise metals which do not require thick diffusion barrier layers and seed layers formed on the diffusion barrier layers, but rather can be deposited in trenches and via openings that are lined with relatively thin liner layers which serve as adhesion and/or wetting layers. For example, as explained in further detail below, metallic materials such as cobalt (Co) or ruthenium (Ru), or alloys thereof, can be used to form a void-free metallic interconnect structures in narrow trench and via openings of an insulating layer.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

An illustrative embodiment of a method for fabricating metallic interconnect structures will now be discussed in further detail with reference to FIGS. 1 through 11B, which schematically illustrate a semiconductor device at various stages of fabrication. To begin, FIG. 1 is a schematic cross-sectional side view of a semiconductor device 100 at an intermediate stage of fabrication comprising an insulating layer formed on a substrate. In particular, the semiconductor structure shown in FIG. 1 comprises a semiconductor substrate 110 (e.g., semiconductor wafer), a FEOL (front-end-of-line)/MOL (middle-of-line) structure 115 formed on the semiconductor substrate 110, a capping layer 120, and an insulating layer 125. While the semiconductor substrate 110 is illustrated as a generic substrate layer, it is to be understood that the semiconductor substrate 110 may comprise one of different types of semiconductor substrate structures and materials.

For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate 110 (e.g., wafer) being processed.

The FEOL/MOL structure 115 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 115 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 115.

In the example process flow illustrated in FIG. 1, the capping layer 120 and the insulating layer 125 are formed as part of an initial phase of a BEOL process module to form a first metallization level of a BEOL interconnect structure. In this regard, the insulating layer 125 can be considered an interlevel dielectric layer (ILD) of a BEOL structure. In another embodiment, the insulating layer 125 may be a final or intermediate PMD layer of an MOL layer in which metallic interconnects are formed to route electrical connections from the FEOL device to first metallization level of the BEOL structure.

The capping layer 120 comprises a layer of insulating/dielectric material such as silicon nitride (SiN), silicon carbide (SiC), silicon carbon nitride (SiCN), hydrogenated silicon carbide (SiCH), or a multilayer stack comprising the same or different types of dielectric materials, etc., or other suitable low-k dielectric materials which are non-reactive with the metallic material that is used to form metallic interconnect structures in the BEOL. In one example embodiment, the capping layer 120 is formed with a thickness in a range of about 2 nm to about 60 nm. The insulating layer 125 is formed of any suitable dielectric material that is commonly utilized in MOL or BEOL process technologies. For example, the insulating layer 125 can be formed of a dielectric material including, but not limited to, silicon oxide ($SiO_2$), silicon nitride (e.g., $Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The thickness of the insulating 125 defines a vertical height (or thickness) of the metallization that is formed within the insulating layer 125, which will vary depending on the application. For example, in one embodiment, the insulating layer 125 is formed with a thickness in a range of about 20 nm to about 800 nm. The capping layer 120 and insulating layer 125 are formed using known deposition techniques, such as, for example, ALD (atomic layer deposition), CVD (chemical vapor deposition) PECVD (plasma-enhanced CVD), or PVD (physical vapor deposition), or spin-on deposition.

Figure 2:
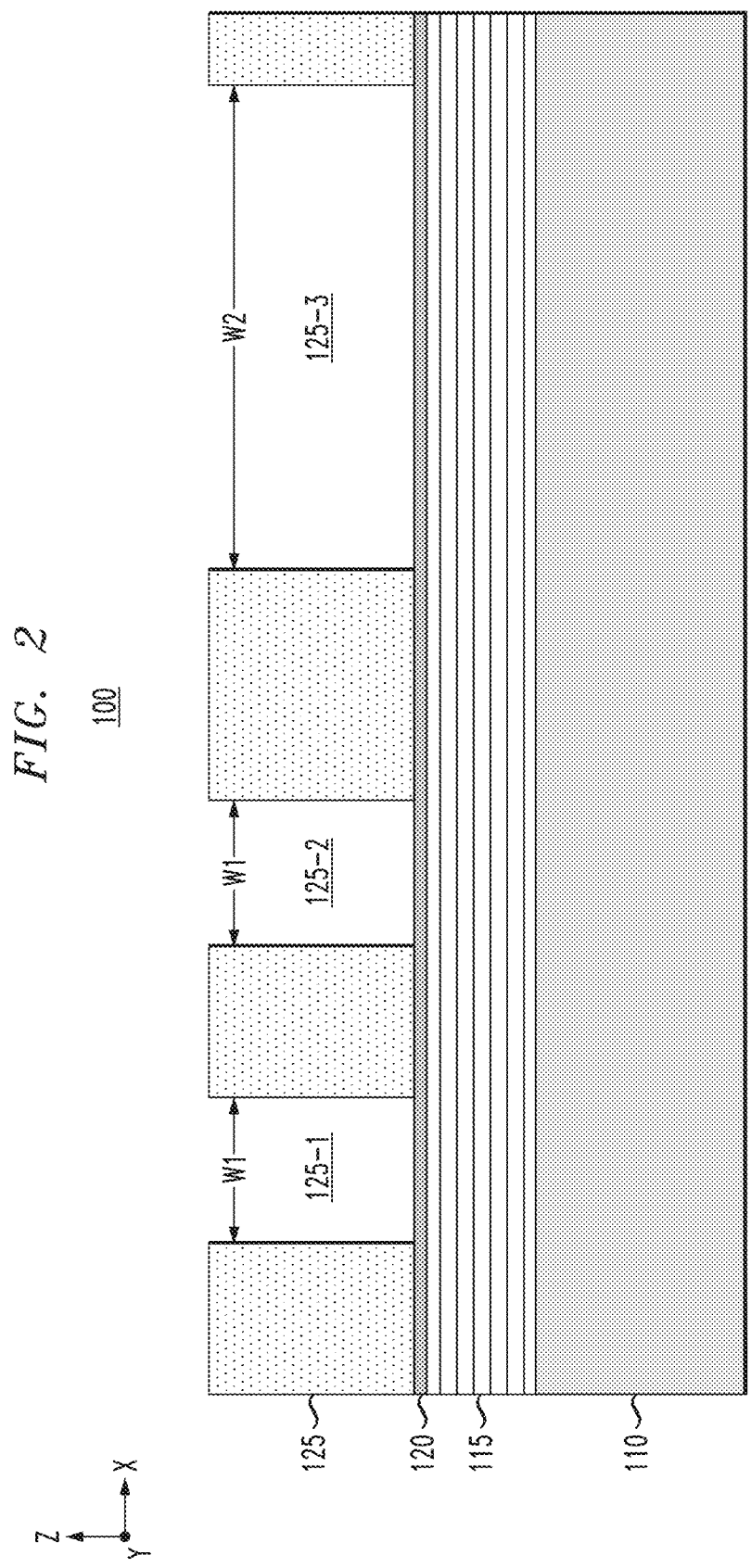

Next, FIG. 2 is a schematic cross-sectional side view of the semiconductor device shown in FIG. 1 after patterning the insulation layer 125 to form a plurality of openings 125-1, 125-2 and 125-3 (e.g., trench openings) in the insulating layer 125. In particular, in the example embodiment, the openings 125-1 and 125-2 comprise narrow openings which define narrow metal lines to be formed with a first width W1 (minimum (1×) feature width), and the opening 125-3 comprises a wide opening which defines a wide metal line to be formed with a second width W2, which is greater than W1. In one embodiment, the first width W1 is in a range of about 20 nm or less, and the second width W2 is in a range of about 2×W1 or greater. In the example embodiment of FIG. 2, the width W1 of the openings 125-1 and 125-2 defines a "critical dimension" (CD) of metal wiring which is subsequently formed by filling the openings 125-1 and 125-2 with metallic material. In this regard, the first width W1 is fixed by the CD of the particular fabrication process that is implemented, and the second width W2 can be, e.g., an integer multiple (e.g., 2×, 3×, etc.) of the first width W1.

For illustrative purposes, FIG. 2 shows the use of a single damascene process in which metallic interconnect structures, e.g., metallic lines (wiring) and metallic vias (vertical interconnects) are separately formed in different insulating layers of a BEOL structure. In other embodiments, openings can be etched in the insulating layer 125 and filled with metallic material using one of various "dual" damascene patterning techniques known in the art in which trenches and via openings are patterned in the same dielectric layer and concurrently filled with metallic material. The dual damascene patterning methods include a "via first" process, a "trench first" process, and a "buried via" process, each of which comprising different sequences for etching the insulating layer 125 to pattern the via openings and trench openings, while concurrently filling the via openings and trench openings with metallic material.

The damascene patterning of the insulating layer 125 can be implemented using any conventional photolithography and etching process, e.g., forming a photoresist mask on the upper surface of the insulating layer 125 which comprises an image of the openings 125-1, 125-2, and 125-3 to be etched into the sacrificial dielectric layer 125, followed by etching the dielectric material of the insulating layer 125 using a dry etch process such as RIE (reactive ion etching), which has an etch chemistry that is suitable to etch the insulating layer 125 selective to the underlying capping layer 120 (which serves as an etch protection layer). The capping layer 120 insulates the metallization from the underlying PMD layer of the FEOL/MOL layer 115. However, in target locations where the metallization formed in the openings 125-1, 125-2, and 125-3 will make contact to vertical contacts formed in the underlying FEOL/MOL layer 115, the capping layer 120 can be patterned by etching openings through the capping layer 120 at the bottom of the openings 125-1, 125-2, 125-3 at such target locations.

Figure 3:
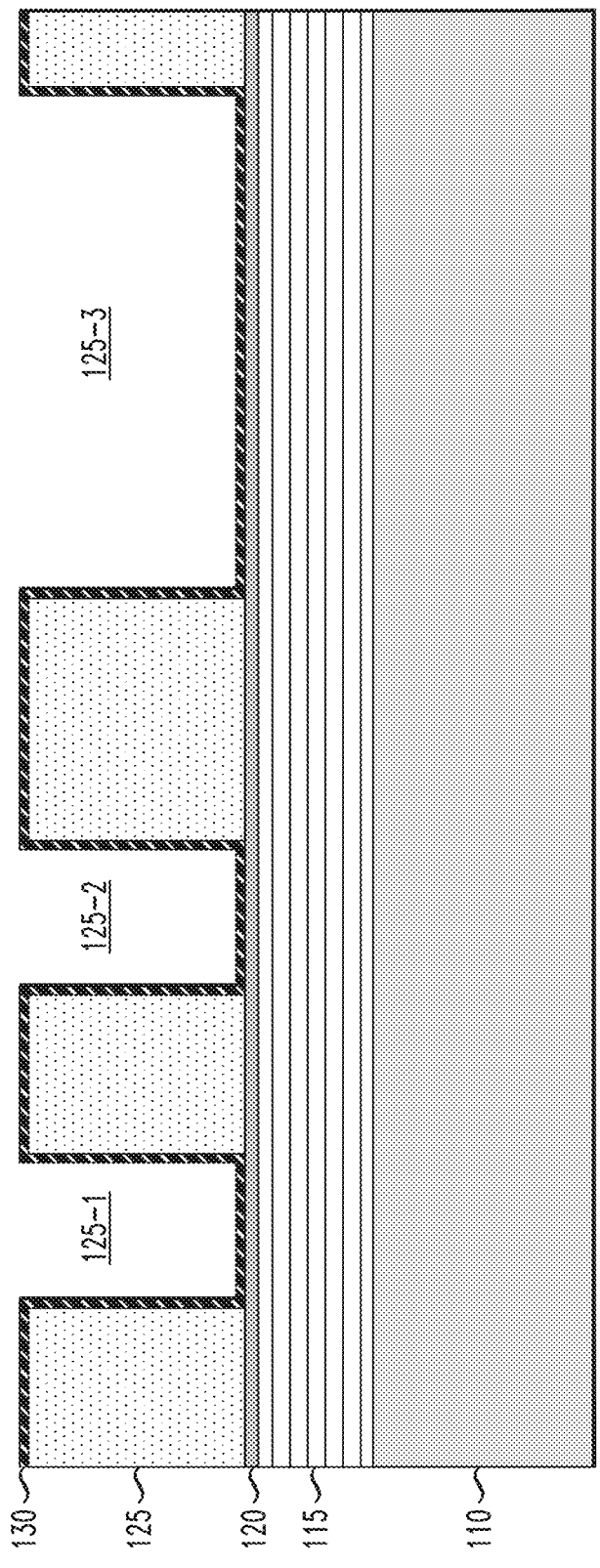

Next, FIG. 3 is a schematic cross-sectional side view of the semiconductor device shown in FIG. 2 after forming a thin conformal liner layer 130 over the surface of the semiconductor device. The thin conformal liner layer 130 comprises a layer of material which serves as an adhesion layer (or wetting layer) for metallic material (e.g., Co, Ru, etc.) that is deposited in the narrow trench openings 125-1 and 125-2, and which serves as a diffusion barrier layer for metallic material (e.g., copper) which is deposited in the wide trench opening 125-3 to prevent the diffusion of metallic material in the wide trench opening 125-3 into the surrounding dielectric material of the insulating layer 125. In one embodiment, the thin conformal liner layer 130 is formed of one or more of tantalum (Ta), titanium (Ti), tantalum nitride (TaN), titanium nitride (TiN), and other materials that are suitable to serve as adhesion layers and diffusion barrier layers. The thin conformal liner layer 130 can be a bi-layer film comprising Ta/TaN or Ti/TiN, for example. The thin conformal liner layer 130 can be deposited using any suitable technique such as ALD, CVD, PVD, etc., which enables the formation of an ultra-thin layers of liner material. In one embodiment, the liner layer 130 is formed with a thickness in a range of about 0.5 nm to about 6 nm.

Figure 4:
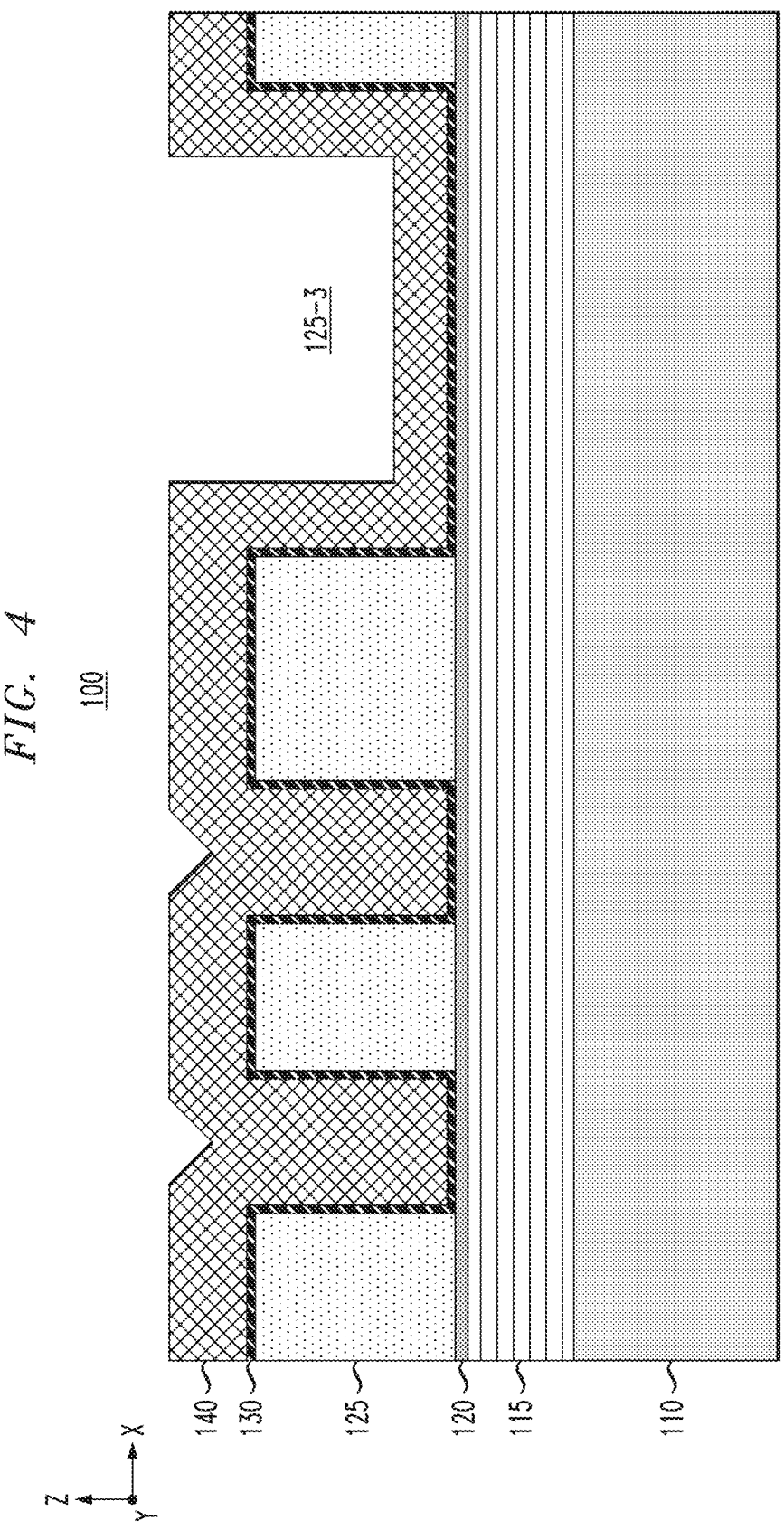
Figure 5:
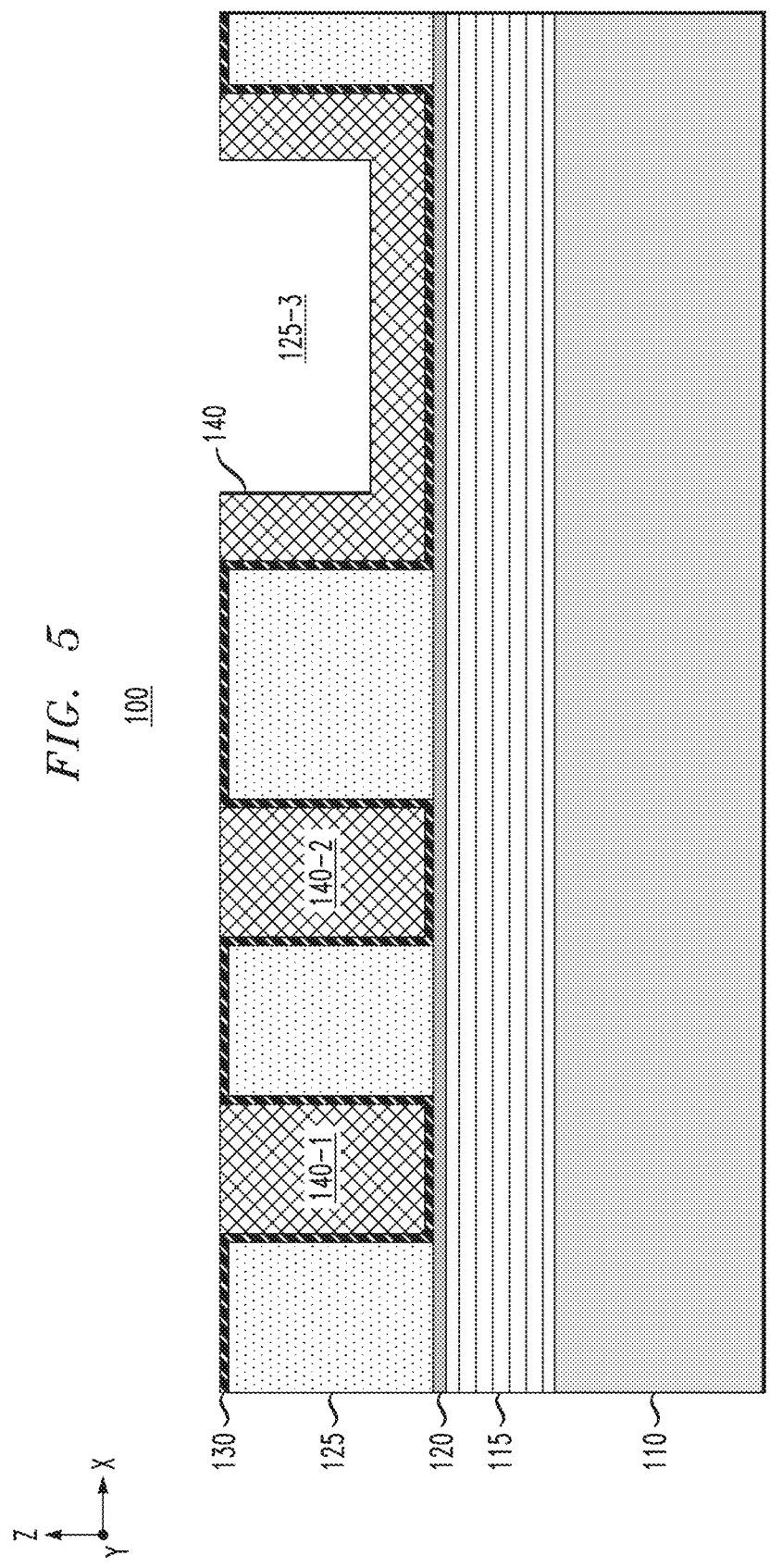

A next phase of the fabrication process comprises depositing a first layer of metallic material which is utilized to form metallic interconnect structures (e.g., metallic lines) in the narrow trench openings 125-1 and 125-2 of the insulating layer 125, using a process flow as schematically illustrated in FIGS. 4 and 5. In particular, FIG. 4 is a schematic cross-sectional side view of the semiconductor device shown in FIG. 3 after depositing a first layer of metallic material 140 to fill the narrow trench openings 125-1 and 125-2 in the insulating layer 125 with the metallic material 140. The first layer of metallic material 140 may comprise Ru, Co, an alloy of Co, an alloy of Ru, or any other type of metallic material which is suitable for MOL or BEOL interconnects, and which does not require a relatively thick diffusion barrier layer to prevent diffusion of the metallic material 140 into the insulating layer 125, nor an additional seed layer to facilitate the deposition and filling of the metallic material 140 into the narrow trench openings 125-1 and 125-2.

Instead, in the example embodiment shown in FIG. 4, only a thin liner layer 130 is used as an adhesion (or wetting layer) to ensure proper adhesion of the metallic material 140 to the insulating material on the sidewall and bottom surfaces of the narrow trench openings 125-1 and 125-2. The metallic material 140 (e.g., Co or Ru) can be deposited directly on the liner layer 130 to form a void-free metallic interconnect structure, while eliminating the need to use a thick diffusion barrier layer and seed layer (as required with copper) which can lead to void formation for reasons as discussed above. The metal deposition process is terminated after the narrow trench openings 125-1 and 125-2 are filled with the metallic material 140, while the wider trench opening 125-3 is only partially filled with the metallic material 140. The first layer of metallic material 140 can be deposited using known dry deposition techniques such as ALD, PVD or CVD.

Next, FIG. 5 is schematic cross-sectional side view of the semiconductor device shown in FIG. 4 after planarizing the surface of the semiconductor structure to remove the overburden portion of the first layer of metallic material 140 disposed on the upper surface of the insulating layer 125, and form metallic lines 140-1 and 140-2 in the narrow trench openings 125-1 and 125-2, respectively, of the insulating layer 125. The planarization process can be implemented using a chemical-mechanical polish (CMP) process with a suitable etch slurry. While some residual portion of the first layer of metallic material 140 remains in the wider trench opening 125-3 after completion of the planarizing process, the residual material 140 is removed as part of the next phase of the fabrication process which comprises forming a metallic interconnect in the wider trench opening 125-3 using a process flow as schematically illustrated in FIG. 6 through FIG. 11B.

Figure 6:
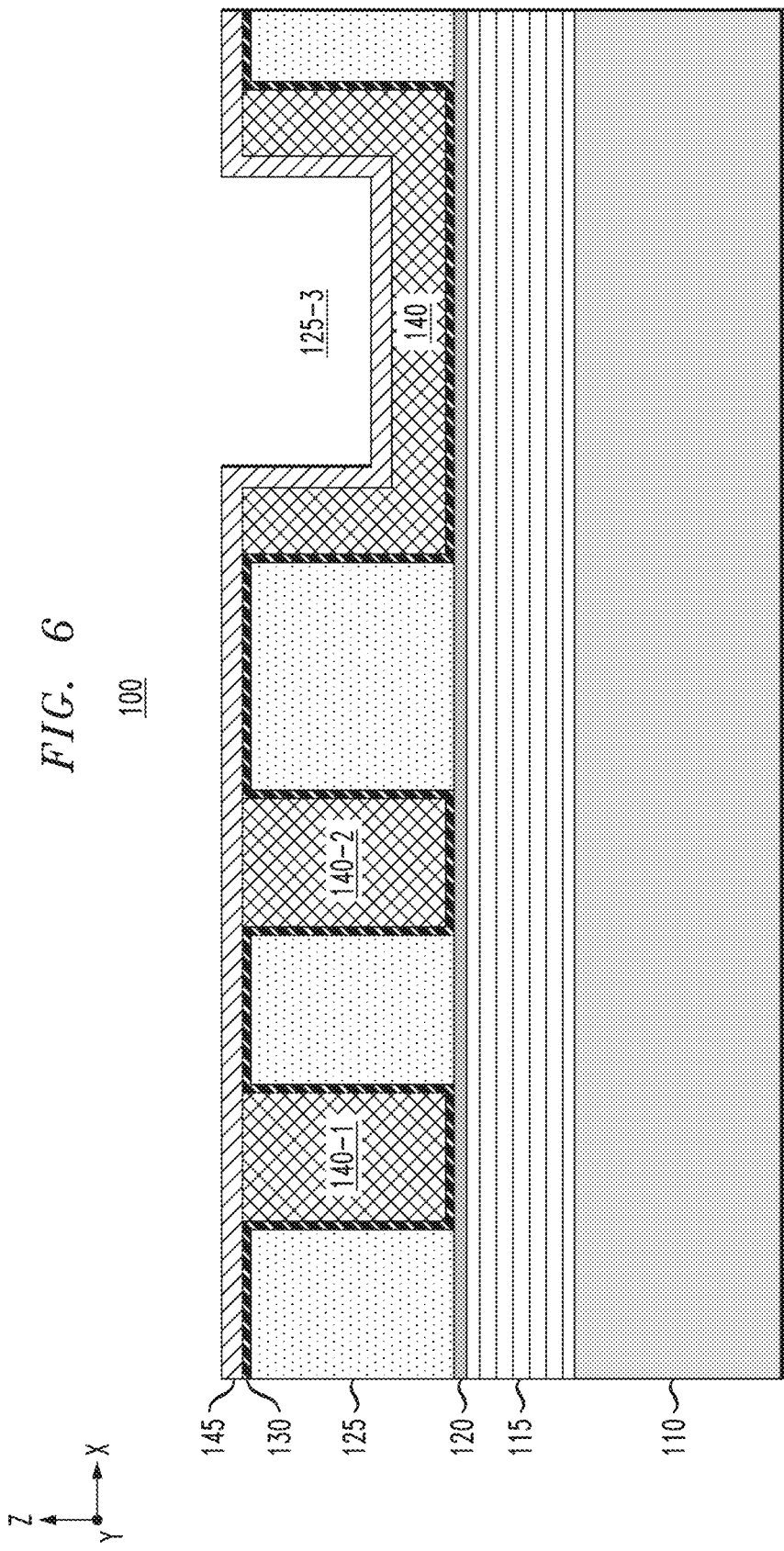
Figure 7:
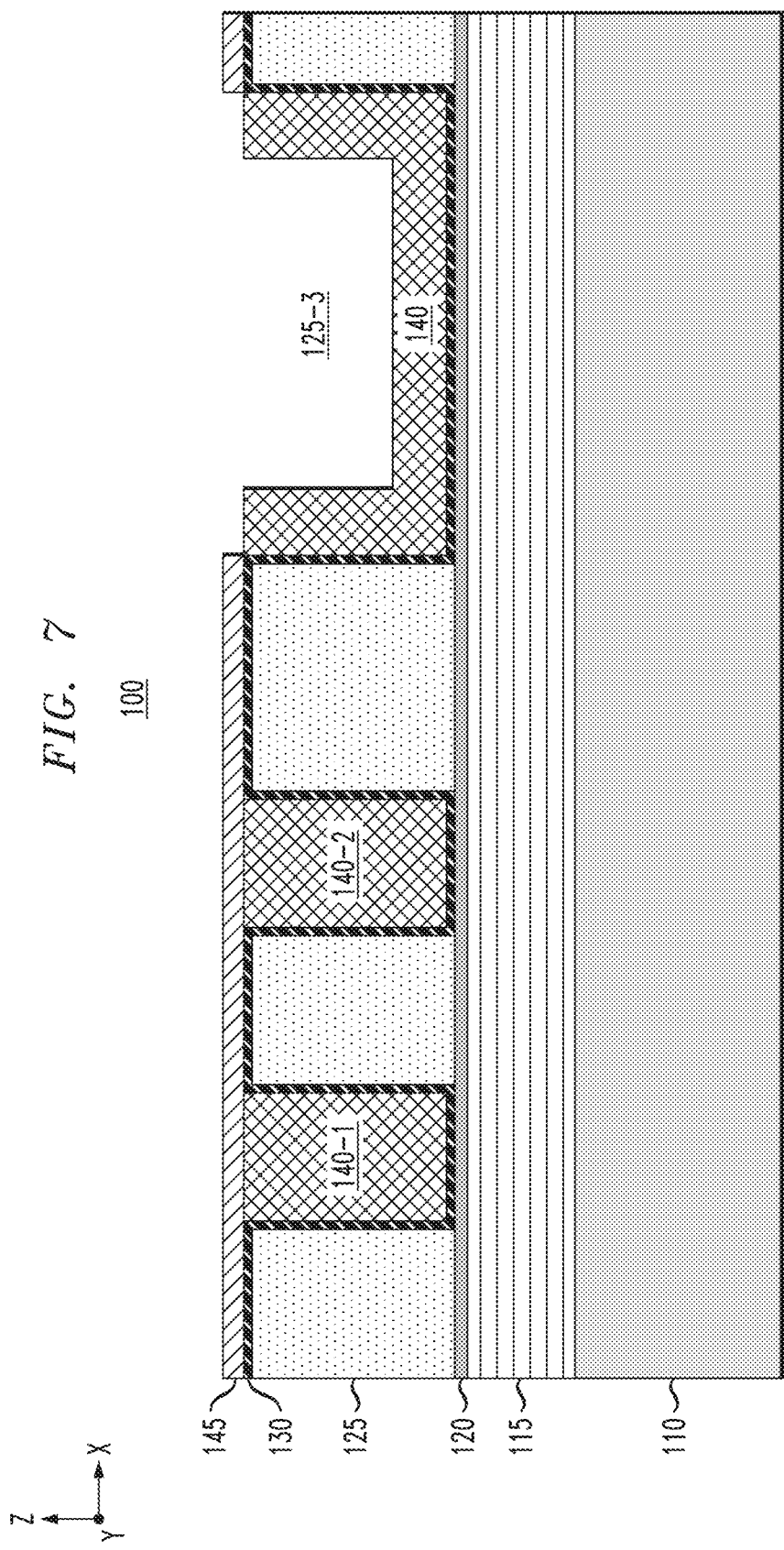

In particular, FIG. 6 is a schematic cross-sectional side view of the semiconductor device shown in FIG. 5 after depositing a conformal etch protection layer 145 over the surface of the semiconductor structure. The etch protection layer 145 can be formed of a material such as Ta, TaN, Ti, TiN, silicon oxide (e.g., $SiO_2$), silicon nitride (SiN), silicon carbon nitride (SiCN), or any other material that is suitable to serve as an etch protection layer for the given process flow. Next, FIG. 7 is a schematic cross-sectional side view of the semiconductor device shown in FIG. 6 after patterning the etch protection layer 145 to remove the portion of the etch protection layer 145 which covers the wide trench opening 125-3 and expose the residual portion of the first layer of metallic material 140 within the trench opening 125-3. The etch protection layer 145 can be patterned using a process flow which comprises forming etch mask (e.g., photoresist mask) having an opening which exposes the portion of the etch protection layer 145 that covers the trench opening 125-3, and then performing a dry etch process (e.g., reactive ion etch (RIE) process) to etch away the exposed portion of the etch protection layer 145 and expose the residual portion of the first layer of metallic material 140 within the wide trench opening 125-3.

Figure 8:
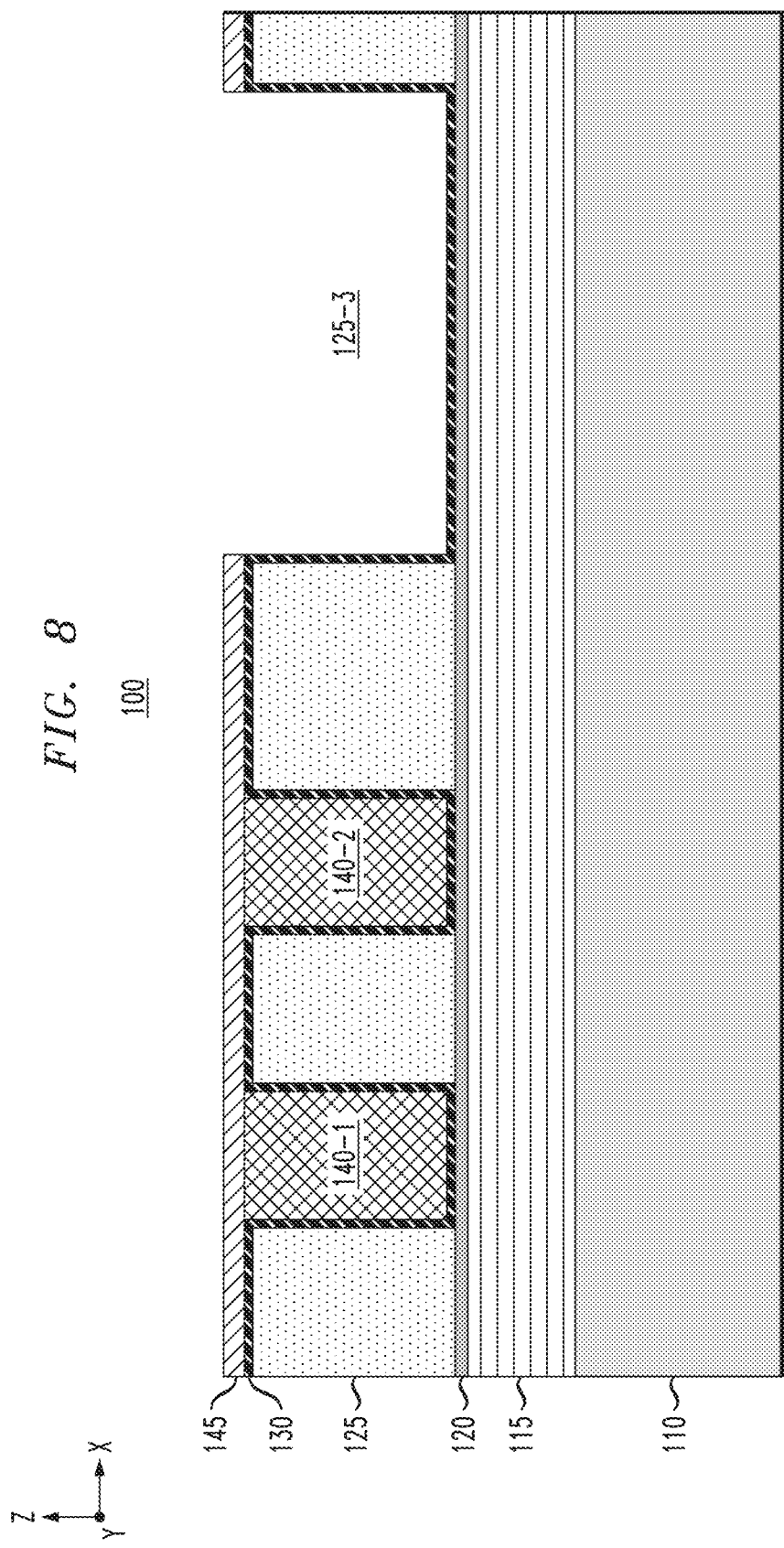

Next, FIG. 8 is a schematic cross-sectional side view of the semiconductor device shown in FIG. 7 after removing the residual portion of the first layer of metallic material 140 within the wide trench opening 125-3. In one embodiment, the residual metallic material 140 is removed using a wet etch process having an etch chemistry which is configured to wet etch away the metallic material 140 within the wide trench opening 125-3 selective to materials of the etch protection layer 145 and the portion of the liner layer 130 disposed on the sidewall and bottom surfaces of the wide trench opening 125-3. During the wet etch process, the etch protection layer 145 protects the metallic interconnects 140-1 and 140-2 from the etching solution. In another embodiment, the residual portion of the first layer of metallic material 140 within the trench opening 125-3 can be etched using a dry etch process (e.g., RIE) having an etch chemistry that is selective to the metallic material 140.

Figure 9:
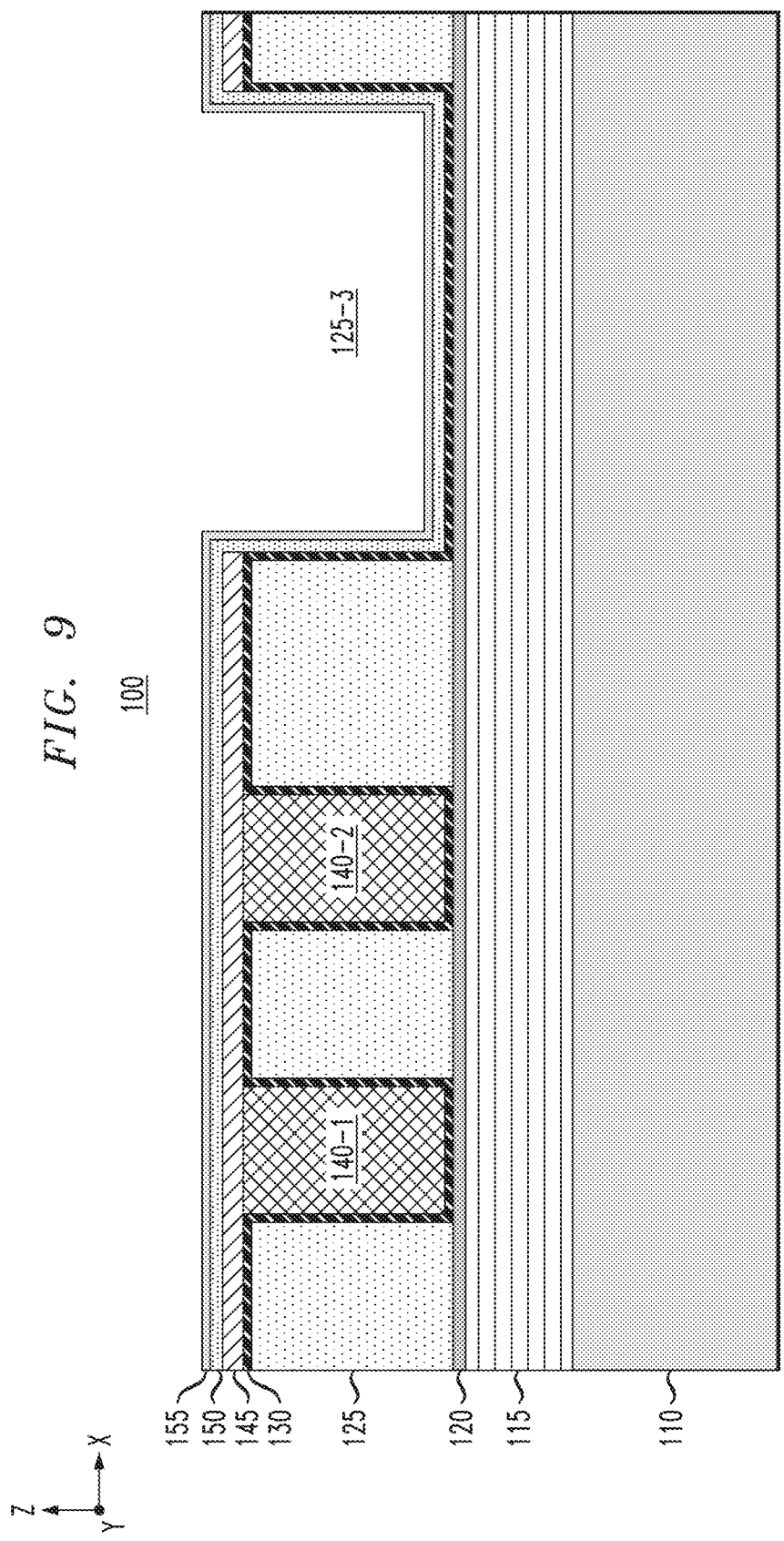

Next, FIG. 9 is a schematic cross-sectional side view of the semiconductor device shown in FIG. 8 after depositing a second conformal liner layer 150 and a conformal seed layer 155 to line the sidewall and bottom surfaces of the wide trench opening 125-3. In one embodiment, the second conformal liner layer 150 is formed of the same material, e.g., Ta, TaN, Ti, TiN, etc., as the conformal liner 130, and is deposited to serve as a diffusion barrier layer. The conformal liner layers 130 and 150 in the wide trench opening 125-3 collectively serve as a relatively thick diffusion barrier layer (which is thicker than using the conformal liner layer 130 alone), which may be desirable to provide sufficient diffusion barrier protection for the metallic material (e.g., copper), which is used to fill the wide trench opening 125-3.

The seed layer 155 is formed of a metallic material including, but not limited to, copper (Cu), cobalt (Co), ruthenium (Ru), tungsten (W), aluminum (Al), iridium (Ir), rhodium (Rh), and alloys thereof, or any other types of metallic material or alloys which are suitable to serve as a seeding layer for a subsequent electroplating process that is used to fill the wide trench opening with metallic material. The seed layer 155 is formed to serve as a plating seed layer in embodiments wherein metallic material is deposited in the wide trench opening 125-3 using electroplating techniques. In one embodiment, the seed layer 155 comprises a layer of copper that is deposited using PVD, for example.

Figure 10:
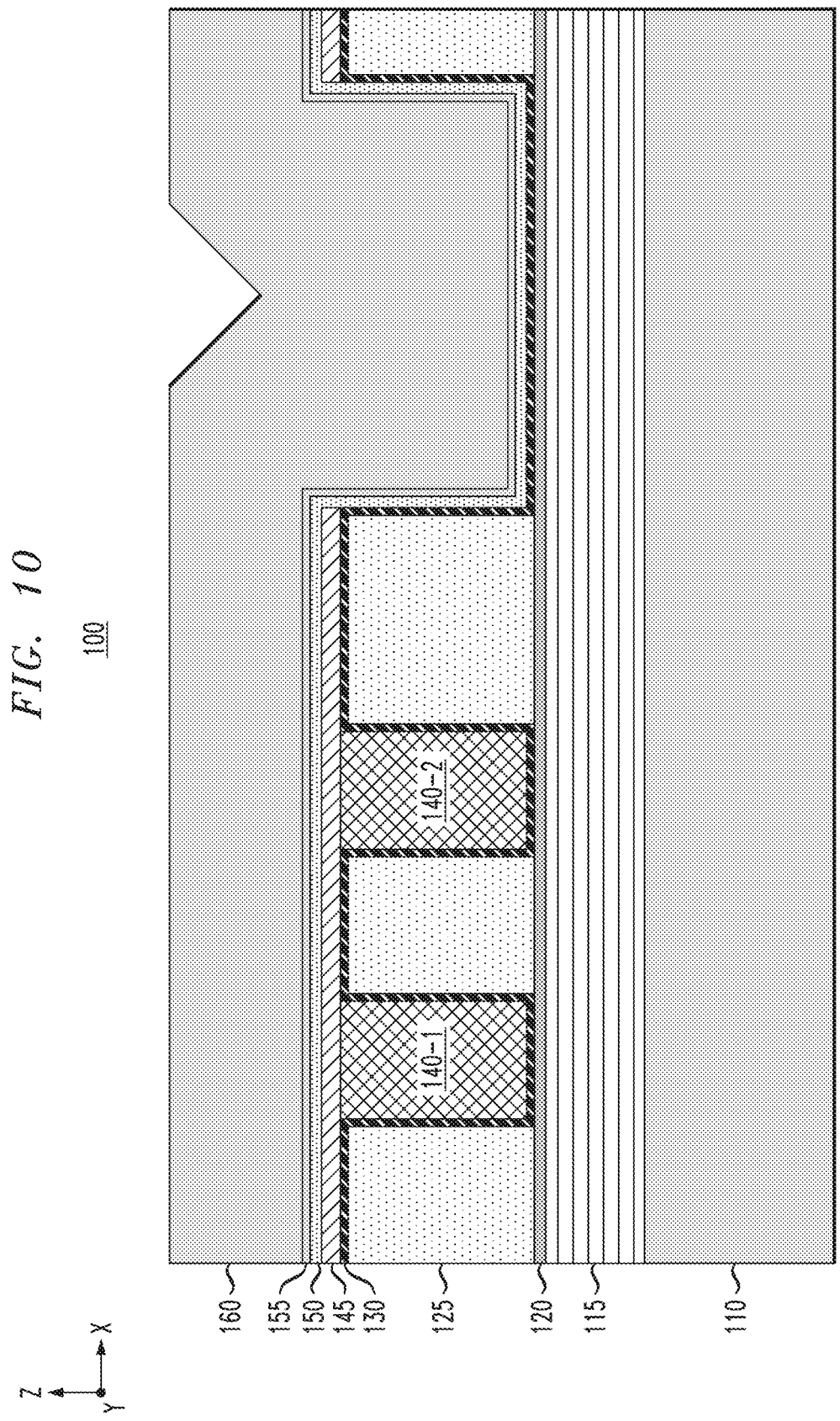
Figure 11A:
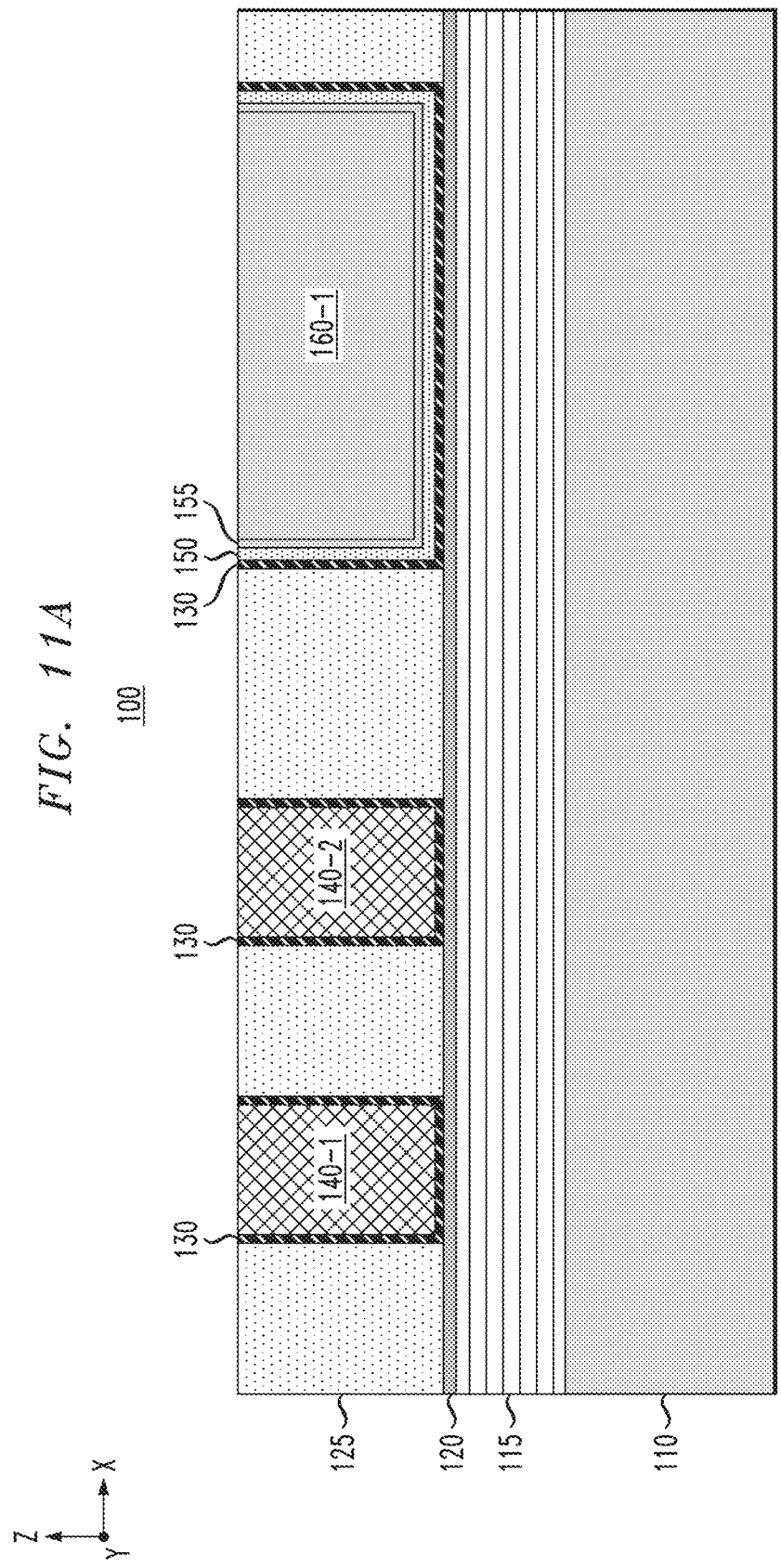
Figure 11B:
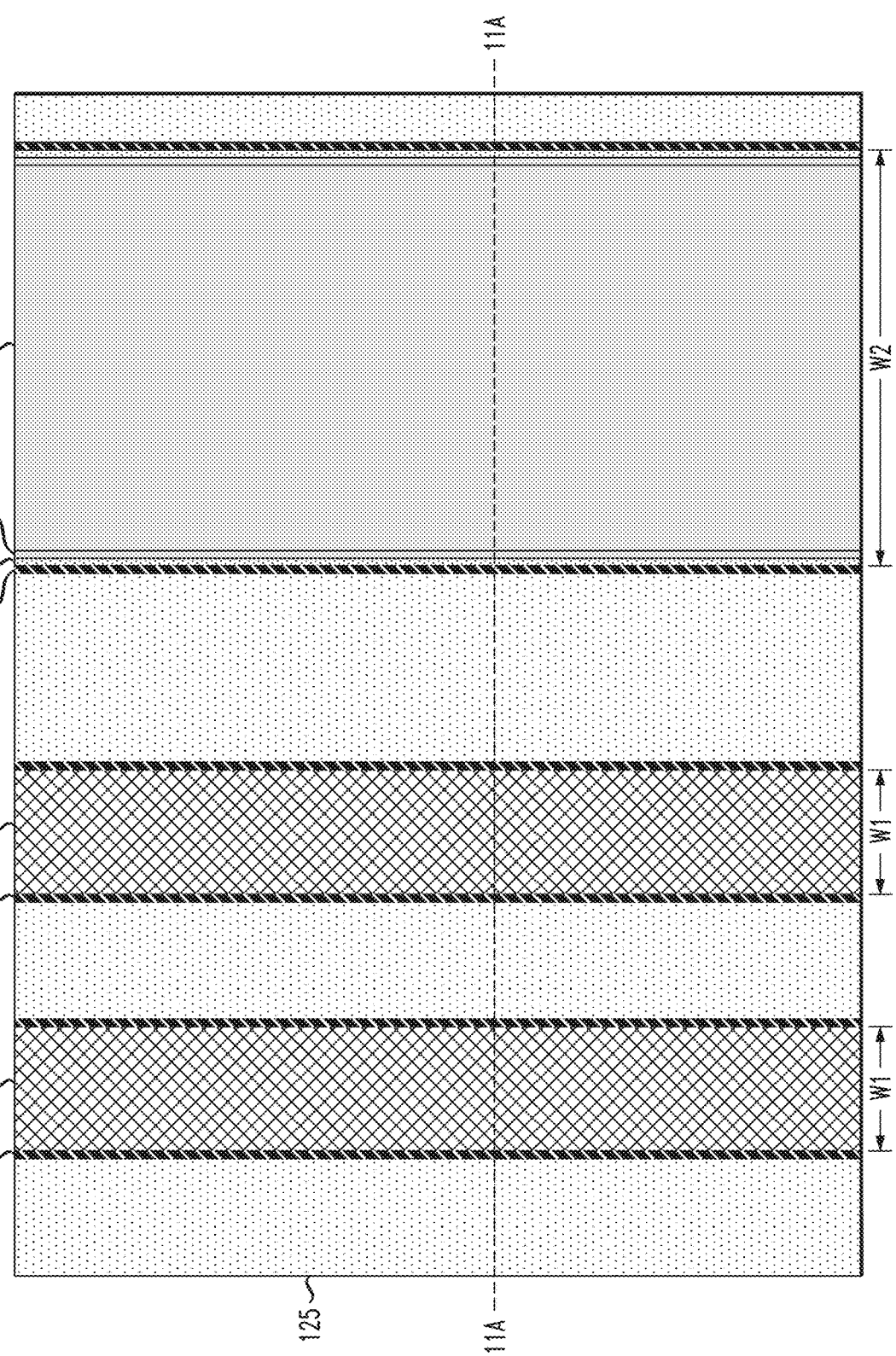

A next phase of the fabrication process comprises depositing a second layer of metallic material which is utilized to form a metallic interconnect structure in the wide trench opening 125-3 of the insulating layer 125, using a process flow as schematically illustrated in FIGS. 10, 11A, and 11B. In particular, FIG. 10 is a schematic cross-sectional side view of the semiconductor device shown in FIG. 9 after depositing a second layer metallic material 160 to fill the wide trench opening 125-3 in the insulating layer 125 with metallic material. FIGS. 11A and 11B are schematic views of the semiconductor device shown in FIG. 10 after planarizing (e.g., CMP) the surface of the semiconductor structure down to the upper surface of the insulating layer 125 to form a metallic line 160-1 in the wide trench opening 125-3 of the insulating layer 125. FIG. 11B is a schematic top plan view of the semiconductor structure shown in FIG. 11A, and FIG. 11A is a schematic cross-sectional side view of the semiconductor structure taken along line 11A-11A in FIG. 11B. The planarizing process is performed to remove the overburden portions of the second layer of metallic material 160, the seed layer 155, and the second conformal liner layer 150, as well as the remaining portion of the etch protection layer 145 disposed on the upper surface of the insulating layer 125. The planarizing process can be performed using a sequence of CMP processes to sequentially remove the overburden layers 160, 155, 150, and 145, wherein each CMP process utilizes a slurry that is configured to chemically etch away the respective materials which form the layers 160, 155, 150, and 145.

In one embodiment, the second layer of metallic material 160 comprises copper, although other types of metallic material which are suitable for MOL or BEOL interconnects can be utilized to form the metallic line 160-1. For example, the second layer of metallic material 160 can be aluminum (Al), tungsten (W), iridium (Ir), a copper alloy, etc. In one embodiment, when the second layer of metallic material 160 comprises copper, the copper material is deposited using a wet deposition process such as electroplating. In the exemplary embodiment as shown in FIG. 11B, the W2 of the wide trench opening 125-3 is sufficiently wide such that metallic material (e.g., copper) can be readily deposited in the wide trench opening 125-3 without the formation of voids during the trench filling process, despite the existence of the thick diffusion barrier layer 130/150 and the seed layer 155.

Figure 12:
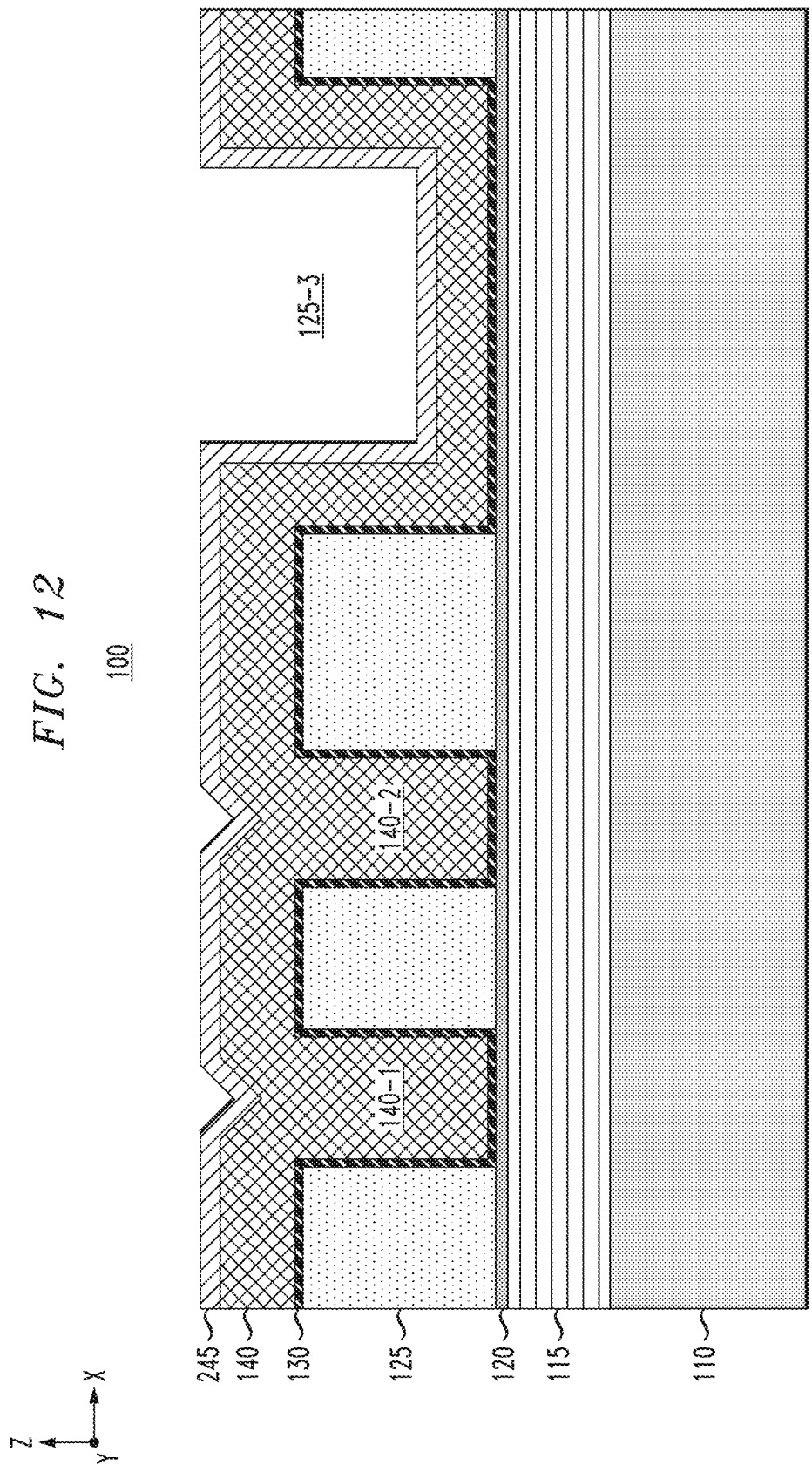
Figure 13:
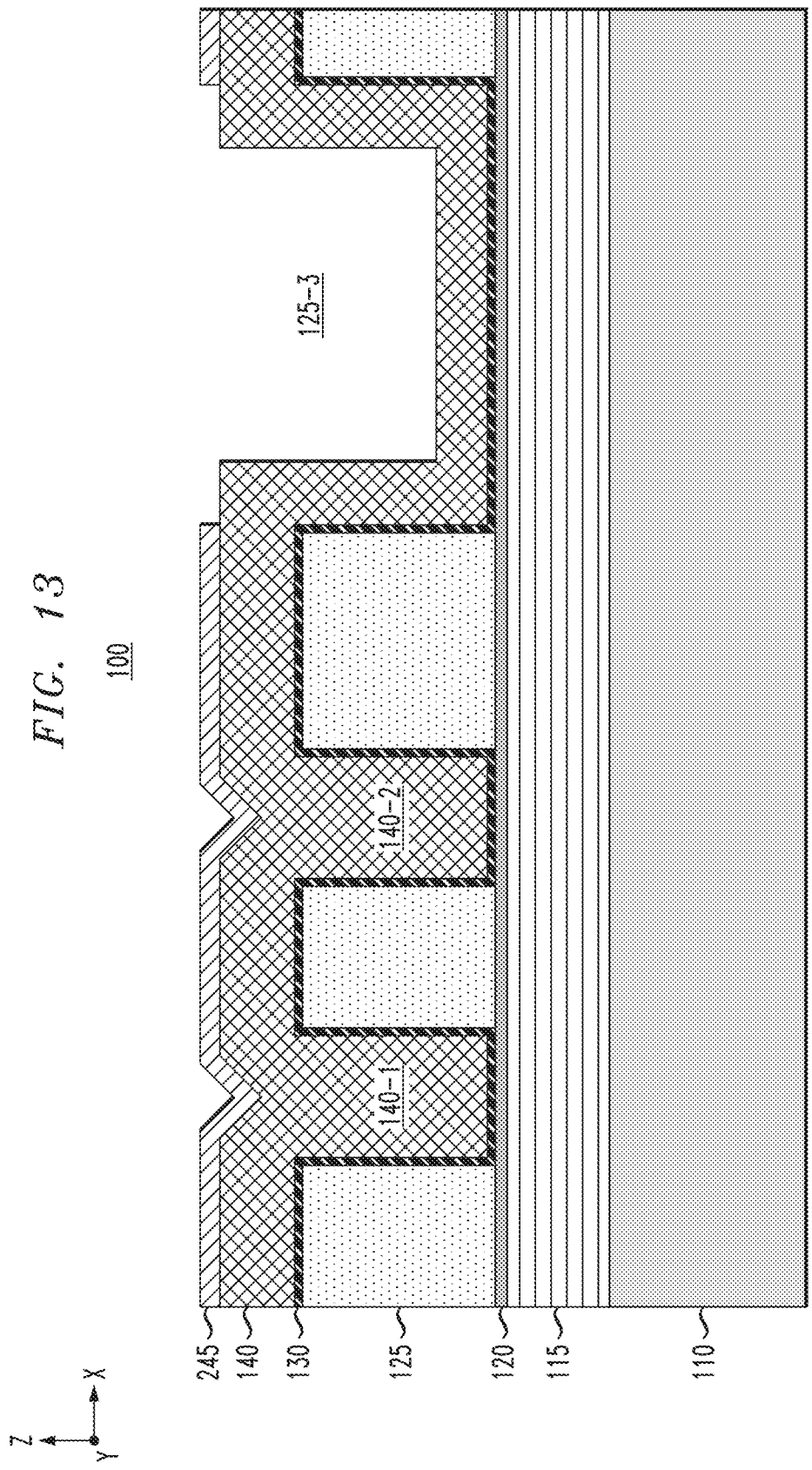
Figure 14:
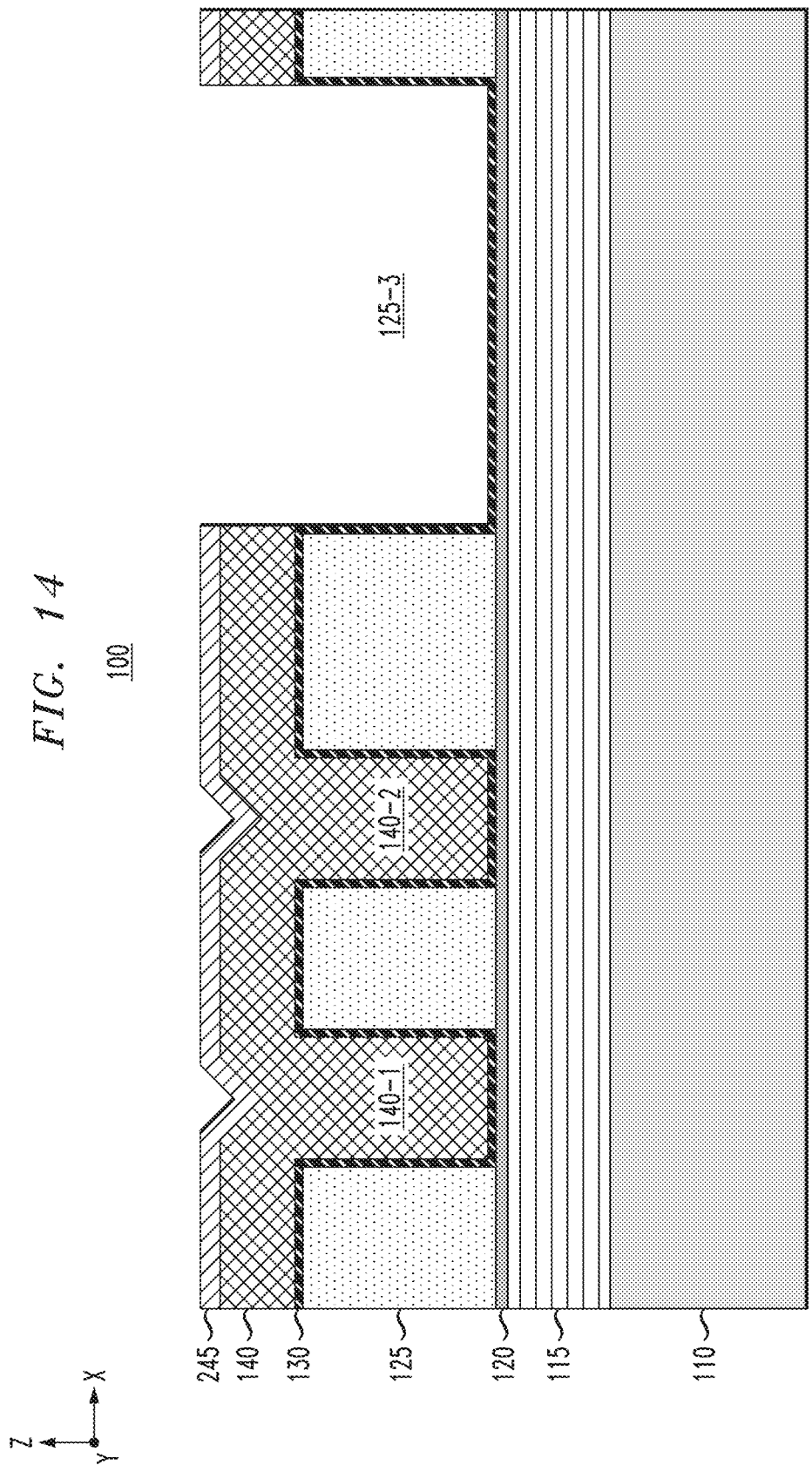

FIGS. 12-14 schematically illustrate a method for fabricating metallic interconnect structures according to another embodiment of the invention. For illustrative purposes, it is assumed that the process flow begins with the semiconductor structure shown in FIG. 4, wherein FIG. 12 is a schematic cross-sectional side view of the semiconductor device shown in FIG. 4 after depositing a conformal etch protection layer 245 over the first layer of metallic material 140. Similar to the etch protection layer 145 of FIG. 6, the etch protection layer 245 can be formed of a material such as Ta, TaN, Ti, TiN, SiO, SiN, SiCN, or any other types of materials that are suitable to serve as an etch protection layer for the given process flow.

Next, FIG. 13 is a schematic cross-sectional side view of the semiconductor device shown in FIG. 12 after patterning the etch protection layer 245 to remove the portion of the etch protection layer 245 which covers the wide trench opening 125-3 and expose a portion of the first layer of metallic material 140 within the trench opening 125-3. The etch protection layer 245 can be lithographically patterned using methods as discussed above with regard to the patterning of the etch protection layer 145 (FIG. 7).

Next, FIG. 14 is a schematic cross-sectional side view of the semiconductor device shown in FIG. 13 after removing the portion of the first layer of metallic material 140 within the wide trench opening 125-3. In one embodiment, the metallic material 140 is removed using a wet etch process having an etch chemistry which is configured to wet etch away the metallic material 140 within the wide trench opening 125-3 selective to materials of the etch protection layer 245 and the portion of the liner layer 130 which is disposed on the sidewall and bottom surfaces of the wide trench opening 125-3. During the wet etch process, the etch protection layer 245 protects the metallic material in the narrow trenches (which form the metallic interconnects 140-1 and 140-2) from the etching solution.

The process flow continues with the same or similar processing steps as discussed above with reference to FIGS. 9, 10 and 11A and 11B. For example, a second conformal liner layer and a seed layer can be sequentially deposited over the surface of the semiconductor structure shown in FIG. 14 to line the sidewall and bottom surfaces of the wide trench opening 125-3, followed by deposition of a second layer of metallic material (e.g., copper) to fill the wide trench opening 125-3 with metallic material. The semiconductor structure is then planarized down to the surface of the insulating layer 125 using CMP to remove the overburden portions of the second layer of metallic material, the seed layer, the second liner layer, the etch protection layer 245, and the first layer of metallic material 140, resulting in the semiconductor device shown in FIGS. 11A and 11B.

It is to be understood that the methods discussed herein for fabricating metallic interconnect structures in MOL or BEOL layers can be incorporated within semiconductor processing flows for fabricating various types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
   forming an insulating layer on a substrate;
   patterning the insulating layer to form a plurality of trench openings in the insulating layer, wherein the plurality of trench openings comprises a first trench opening having a first width, and a second trench opening having a second width, which is greater than the first width;
   depositing a first layer of liner material to form a first liner layer on sidewall and bottom surfaces of the first and second trench openings;
   performing a first metal deposition process for depositing a layer of a first metallic material to fill the first trench opening with the first metallic material, wherein the first metallic material within the first trench opening comprises a first metallic line;
   terminating the first metal deposition process at a point in time after the first trench opening is completely filled with the first metallic material and before the second trench opening is completely filled with the first metallic material such that the second trench is partially filled with the first metallic material at the point in time when the first metal deposition process is terminated;
   forming a patterned etch protection layer which is disposed over an entirety of an upper surface of the first metallic material within the first trench opening and an entirety of an upper surface of the insulating layer, wherein the patterned etch protection layer comprises a patterned opening which exposes the first metallic material within the second trench opening without exposing any portion of the upper surface of the insulating layer, wherein forming the patterned etch protection layer, comprises:
      depositing a conformal layer of etch protection material over the layer of the first metallic material; and
      patterning the conformal layer of etch protection material to remove a portion of the conformal layer of etch protection material which covers the second trench opening and expose the first metallic material within the second trench opening without exposing any portion of the first metallic material and the upper surface of the insulating layer outside the second trench opening;
   performing an etch process to remove the exposed first metallic material from the second trench opening, while the patterned etch protection layer protects the first metallic material within the first trench opening and the upper surface of the insulating layer from being etched during the etch process;
   performing a second metal deposition process for depositing a layer of a second metallic material to fill the second trench opening with the second metallic material, wherein the second metallic material within the second trench opening comprises a second metallic line, wherein the second metallic material is different from the first metallic material; and
   performing a planarization process to remove the patterned etch protection layer and overburden portions of the layers of the first and second metallic material disposed over the upper surface of the insulating layer.

2. The method of claim 1, wherein the first metallic material comprises cobalt.

3. The method of claim 1, wherein the first metallic material comprises ruthenium.

4. The method of claim 1, wherein the second metallic material comprises copper.

5. The method of claim 1, wherein the second width is at least two times greater than the first width.

6. The method of claim 5, wherein the first width is about 20 nm or less.

7. The method of claim 1, wherein the first layer of liner material comprises one of tantalum, titanium, tantalum nitride, and titanium nitride.

8. The method of claim 1, further comprising depositing a second layer of liner material to form a second liner layer on the first liner layer on the sidewall and bottom surfaces of the second trench opening, prior to depositing the layer of the second metallic material.

9. The method of claim 8, further comprising depositing a metallic seed layer on the second liner layer in the second trench opening, prior to depositing the layer of the second metallic material.

10. The method of claim 1, wherein performing the etch process comprises performing a wet etch process with an etch chemistry that is configured to etch the first metallic material within the second trench opening selective to the etch protection layer and the first liner layer.

11. The method of claim 1, wherein the insulating layer comprises an interlayer dielectric layer of a back-end-of-line structure.

12. The method of claim 1, wherein the insulating layer comprises a pre-metal dielectric layer of a middle-of-line structure.

13. The method of claim 9, wherein the seed layer comprises one of copper, cobalt, ruthenium, tungsten, aluminum, iridium, and rhodium, and alloys thereof.

14. The method of claim 9, wherein the seed layer serves as a plating seed layer, and wherein the second metal deposition process is performed by electroplating the layer of the second metallic material on the plating seed layer.

* * * * *